United States Patent [19]

Toyoda et al.

[11] 4,419,745

[45] Dec. 6, 1983

[54] SEMICONDUCTOR MEMORY DEVICE

[75] Inventors: Kazuhiro Toyoda, Yokohama; Chikai Ono, Kawasaki, both of Japan

[73] Assignee: Fujitsu Limited, Kawasaki, Japan

[21] Appl. No.: 179,793

[22] Filed: Aug. 20, 1980

[30] Foreign Application Priority Data

Aug. 30, 1979 [JP] Japan .............................. 54-110719

[51] Int. Cl.³ ............................................. G11C 11/40
[52] U.S. Cl. .................................. 365/174; 365/156; 365/226; 307/238.3
[58] Field of Search ............... 365/174, 189, 226, 210, 365/103, 104, 156; 307/238.1, 238.3, 238.6; 357/45

[56] References Cited

U.S. PATENT DOCUMENTS

| 3,959,781 | 5/1976 | Mehta et al. | 365/210 |
| 4,228,525 | 10/1980 | Kawarada et al. | 365/174 |
| 4,231,108 | 10/1980 | Suzuki et al. | 365/174 |
| 4,231,109 | 10/1980 | Ono et al. | 365/174 |

Primary Examiner—Joseph A. Popek
Attorney, Agent, or Firm—Staas & Halsey

[57] ABSTRACT

An improvement of a semiconductor integrated circuit device of a memory cell array which is formed by integrated injection logic memory cells. The semiconductor integrated circuit includes integration injection logic memory cells which are arranged in matrix form, word lines and bit lines which are connected to the memory cells arranged in the row or column directions and which are formed by a semiconductor bulk. A current source is provided around the middle portion of each word line.

7 Claims, 12 Drawing Figures

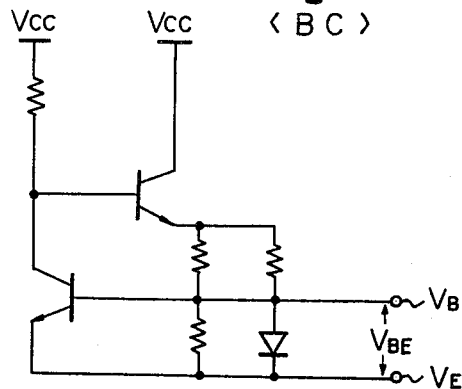
Fig. 3 (BC)
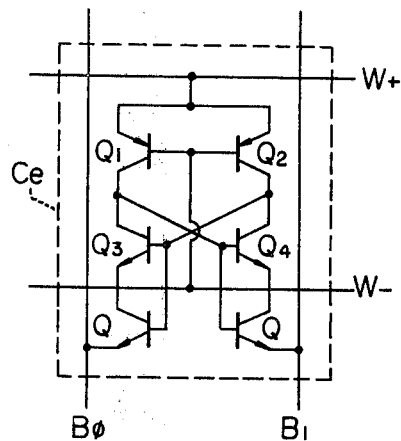
Fig. 4A
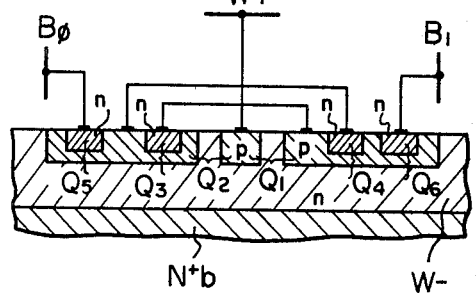
Fig. 4B
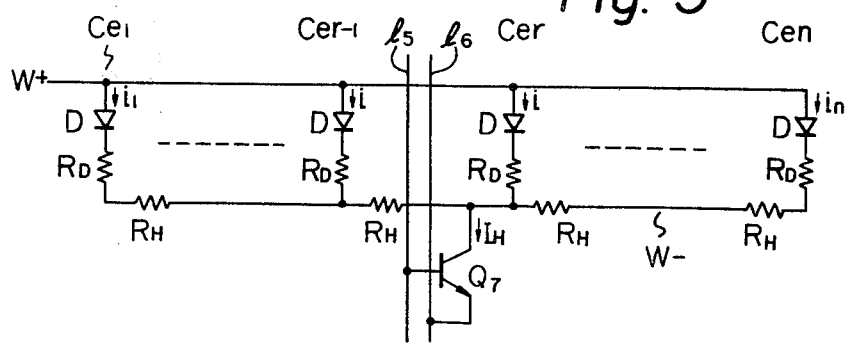
Fig. 5

SEMICONDUCTOR MEMORY DEVICE

FIELD OF THE INVENTION

The present invention relates to a semiconductor memory device in which memory cells formed by I²L (Integrated Injection Logic) are arranged as a memory array and, more particularly, to a hold current supplying circuit for the device.

BACKGROUND OF THE INVENTION

In recent years the integration degree of semiconductor memories has been continually increasing. However, in conventional memory cells used in a semiconductor memory, resistors are used as load impedances of flip-flop transistors which are used in the memory cells, and also, an isolation between transistors is required, so that the conventional memory cells are large in size. Therefore, a memory chip is also large in size and the density of the memory chips which are included in one wafer can not be increased, so that the cost of a semiconductor memory is expensive.

For the purpose of obtaining memory cells having small dimensions, memory cells using Integrated Injection Logic (I²L) are used.

Such I²L memory cells can be formed with high integration density as disclosed, for example, in the articles "Write Current Control and Self Powering in a Low Power Memory Cell", IEEE, SSC, Jun., 1973, and "Superintegrated Memory Shares Functions on Diffused Islands", Electronics, Feb. 14, 1972, p83–p86. The former discloses a method of controlling a write current to the I²L memory cell and the latter discloses a basic idea with respect to the I²L memory cell.

As disclosed in the above mentioned articles, the I²L memory cell comprises: a pair of first and second transistors, which have emitters forming an injector which is connected to a work line W+, and said first and second transistors have a first polarity; a pair of third and fourth transistors, which have a collector connected to a collector of the first or second transistor, a base of the third transistor which is connected to the collector of said fourth transistor and a base of the fourth transistor which is connected to the collector of said third transistor, and which have a second polarity, and; a bulk, that is, a word line W−, which is connected to the bases of the first and second transistors and to emitters of the third and fourth transistors.

The I²L memory cells are arranged as the memory array. In these I²L memory cells, the word line W− is formed as the bulk, and the bulk usually consists of two n-type layers, an epitaxial layer and a buried layer. The epitaxial layer is formed on the buried layer which has higher density of the impurity than the epitaxial layer. Therefore, the bulk, that is, the word line W−, has a larger resistance than a metalic wire, and this resistance exists between each cell.

When the bulk is used as the word line W− which supplies the hold current, the characteristics of the cells are different in accordance with the positions of the cells in the line of the array. In other words, in the conventional I²L memory the hold current source is provided at only one end of the word line W−. Therefore, injection currents which are supplied to the memory cells connected to the word line are not uniform due to the bulk resistance. Consequently, in the memory cell arranged near the end of the word line, a write threshold current Iwth increases and, also, the width of the write pulse increases.

In order to equalize the injection currents supplied to I²L memory cells, the inventors of the present invention invented, prior to the present invention, an improved I²L memory in which a hold-current source is provided at each end of the word line W−, as disclosed in the U.S. Patent Application Ser. No. 48256, filed on June 13, 1979, now U.S. Pat. No. 4,231,108. By this improved I²L memory, almost uniform distribution of the injection currents was obtained. However, there are still problems in this prior I²L memory. That is, because two current sources are required in each memory-cell array in a word line, the integration degree is lowered. In addition, because two wiring lines are required for connecting bases and emitters of the two current sources at the ends of a word line, the wiring becomes complex.

OBJECTS AND SUMMARY OF THE INVENTION

An object of the present invention is to decrease the integration degree of the I²L memory device without deteriorating the characteristics of uniform injection currents.

Another object of the present invention is to simplify the wiring in the I²L memory device by providing a single current source at the middle portion of each word line.

In order to achieve the above objects, there is provided, according to the present invention, a semiconductor memory device having a plurality of word lines formed on a semiconductor substrate, and a plurality of integrated-injection logic memory cells commonly connected to each of said word lines, said memory cells being arranged in a matrix form, characterised in that said semiconductor memory device comprises a current source connected to the middle portion of each of said word linesand a bias circuit for providing a bias voltage to all of said current source.

BRIEF DESCRIPTION OF THE DRAWING

These and other object and advantages of this invention may best be understood by reference to the following detailed description of an embodiment, when read in conjunction with the accompanying drawings, wherein;

FIG. 3 is a circuit diagram of a bias circuit included in the device of FIG. 1;

FIG. 4A is a circuit diagram of a memory cell included in the array of FIG. 2;

FIG. 4B illustrates a cross-sectional view of the memory cell for the circuit of FIG. 4A;

FIG. 5 illustrates an equivalent circuit of one row in the memory-cell array of FIG. 2;

PREFERRED EMBODIMENT OF THE INVENTION

Figure 1:
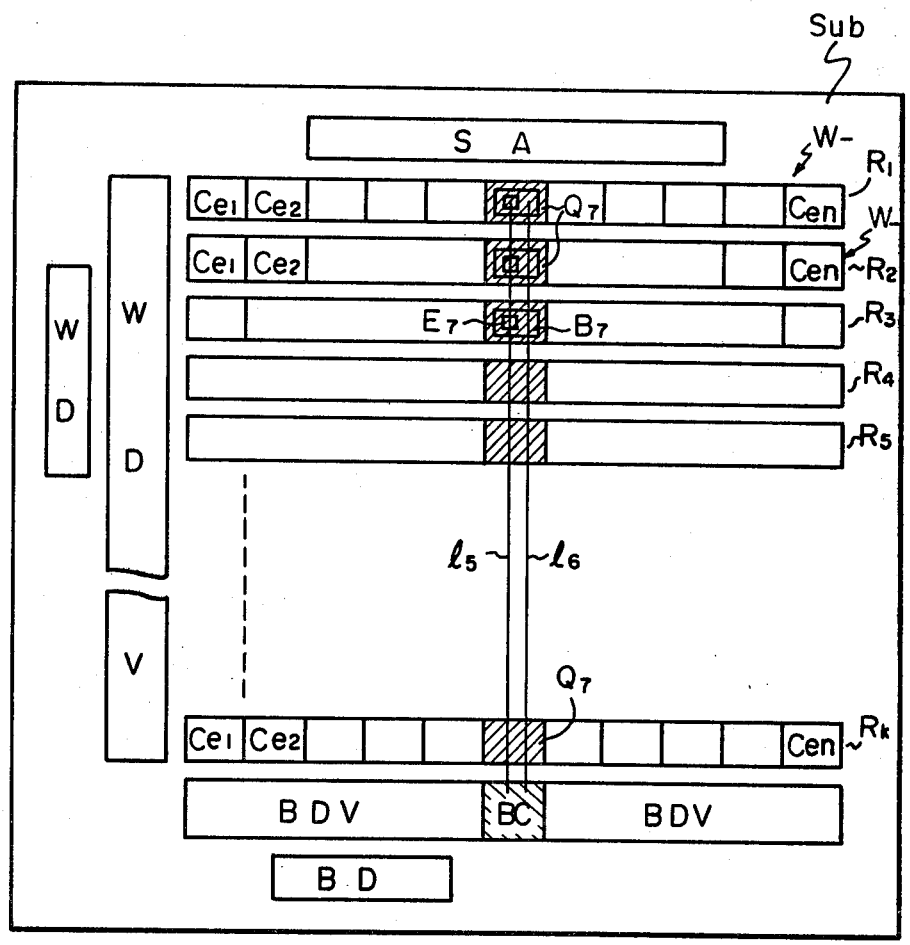
FIG. 1 illustrates a plan view of a semiconductor memory device according to one embodiment of the present invention.

FIG. 1 illustrates a plan view of a semiconductor memory device according to an embodiment of the present invention. Referring to FIG. 1, Sub represents a semiconductor substrate. On the semiconductor substrate Sub, a number of memory cells $Ce_1, Ce_2, \ldots,$ and $Ce_n$ are arranged in a matrix. The matrix has a plurality of rows $R_1, R_2, \ldots, R_k$, each of the rows being a word line $W-$. Each word line $W-$ is a bulk of the semiconductor substrate Sub and is connected commonly to all memory cells in one row. Accordinng to the present invention, a transistor $Q_7$ as a current source is provided at the middle portion of each word line $W-$. The base and the emitter of each of the current source transistors $Q_7$ are connected through bias lines $l_5$ and $l_6$, respectively, to a bias circuit BC. The bias circuit BC is provided at the middle portion of a bit-driver array BDV. The other notations SA, WD, WDV, and BD in FIG. 1 represent a sense amplifier, a word decoder, a word driver, and a bit decoder, respectively.

Figure 2:
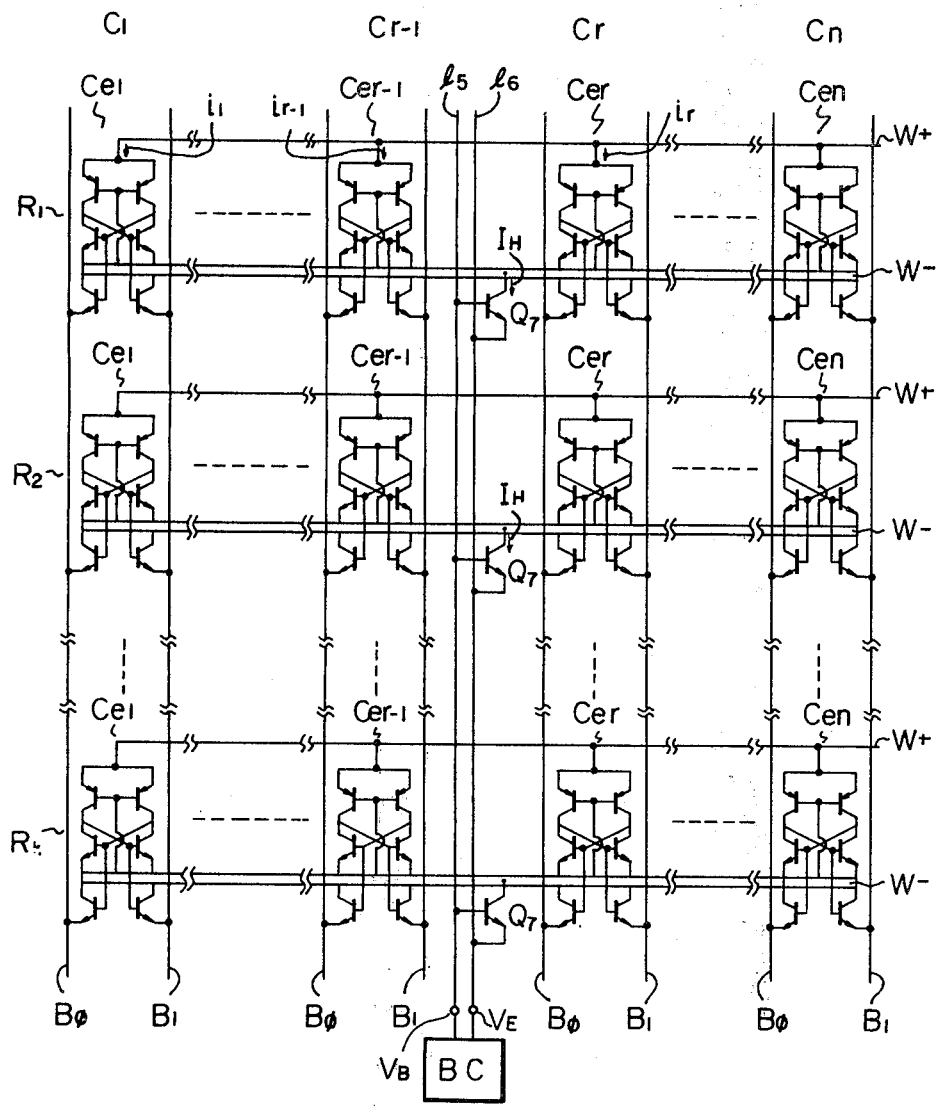
FIG. 2 is a circuit diagram of a memory cell array included in the device of FIG. 1.

Illustrated in FIG. 2 is a circuit diagram of the memory cells included in the device of FIG. 1. Referring to FIG. 2, each of the rows $R_1, R_2, \ldots, R_k$ contains a plurality of memory cells $Ce_1, \ldots Ce_{r-1}, Ce_r, \ldots, Ce_n$ formed by integrated injection logic. These memory cells in each row are commonly connected between word lines $W+$ and $W-$. There are n columns $C_1, \ldots, C_n$, each of which contains k memory cells $Ce_1, \ldots,$ or $Ce_k$. These memory cells in each column are connected between bit lines $B_0$ and $B_1$. The collector of a current source transistor $Q_7$ is connected to the middle portion of each word line $W-$. The base and the emitter of the transistor $Q_7$ are connected to the bias lines $l_5$ and $l_6$, respectively. The bias lines $l_5$ and $l_6$ extend in the longitudinal direction through the middle portion of the matrix array and are connected to the bias circuit BC. An example of the bias circuit BC is illustrated in FIG. 3. By means of the bias circuit, a predetermined voltage $V_{BE}$ is supplied between the base and emitter of each transistor $Q_7$ through the output terminals $V_B$ and $V_E$ and through the bias lines $l_5$ and $l_6$ respectively so that all of the current source transistors $Q_7$ are turned on. When the transistor $Q_7$ is turned on, the hold current $I_H$ is conducted through the transistor $Q_7$. A hold current $I_H$ is the sum of injection current $i_1, i_2, \ldots, i_n$ conducted through the memory cells $Ce_1, Ce_2, Ce_n$, respectively, in one row.

FIG. 4A is a circuit diagram of one memory cell included in the matrix array of FIG. 2. Referring to FIG. 4A, the main body of the memory cell is the same as a flip-flop comprising lateral pnp load transistors $Q_1$ and $Q_2$ and npn driving transistors $Q_3$ and $Q_4$. The flip-flop is connected to the bit lines $B_0$ and $B_1$ through npn transistors $Q_5$ and $Q_6$ for reading out or writing in data. FIG. 4B illustrates a cross-sectional view of the memory cell of FIG. 4A. Referring to FIGS. 4A and 4B, a p-type conduction region connected to the word line $W+$ is an injector actuated as common emitters of lateral pnp load transistors $Q_1$ and $Q_2$. The usual collector regions of npn transistors $Q_3$ and $Q_4$ connected to the word line $W-$ are used as emitters. The usual emitter regions of the npn transistors $Q_3$ and $Q_4$ are used as collectors. Thus, a bulk, that is, an n-type conduction region, which is commonly used as the bases of the pnp transistors $Q_1$ and $Q_2$, and as the emitters of the npn transistors $Q_3$ and $Q_4$, can be used as a buried word line $W-$, so that the cells can be formed in a high density.

Referring to the memory cell illustrated in FIG. 4A, the transistors $Q_3$ and $Q_4$ are placed in the on and off state alternately. That is, for example, when the transistor $Q_3$ is placed in the on state, the transistor $Q_4$ is placed in the off state.

The common emitter n-type region of the word line $W-$, consists of two n-type layers, an epitaxial layer and a buried layer. The epitaxial layer is formed on the buried layer which has higher density of the impurity than the epitaxial layer. Therefore, the word line $W-$ has a larger resistance than a metalic layer, and this resistance is due to the bulk resistance and exists between each cell. This resistance deteriorates the characteristics of the semiconductor memory which utilizes integrated injection logic memory cells. This is due to the following.

As the cells $Ce_1, Ce_2, \ldots Ce_n$ are equivalent to diodes which are connected between the word line $W+$ and the word line $W-$, one row of the circuit illustrated in FIG. 2 can be illustrated as an equivalent circuit in FIG. 5. Referring to FIG. 5, D designates the equivalent diode, $R_0$ designates a series resistance which is due to the afore-mentioned n-type epitaxial layer, and $R_H$ designates a resistance component between the memory cells $Ce_1, Ce_2, \ldots, Ce_n$. In the middle portion of the row of the equivalent circuit, the current source transistor $Q_7$ is connected to the word line $W-$.

Figure 6:
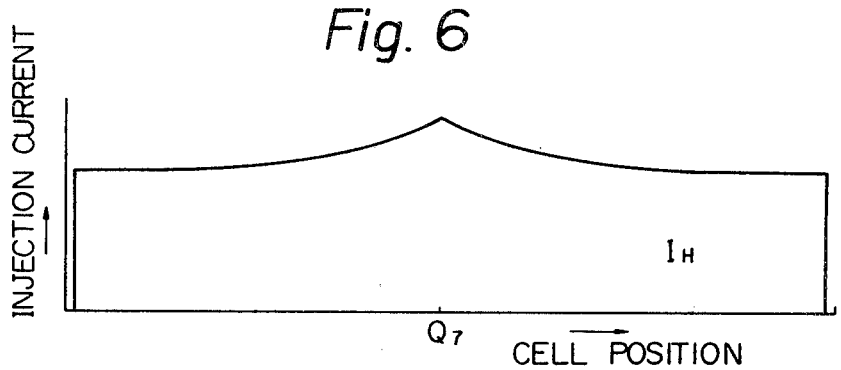
FIG. 6 is a diagram illustrating a distribution of injection currents supplied to the memory cells in the row of FIG. 5.
Figure 7:
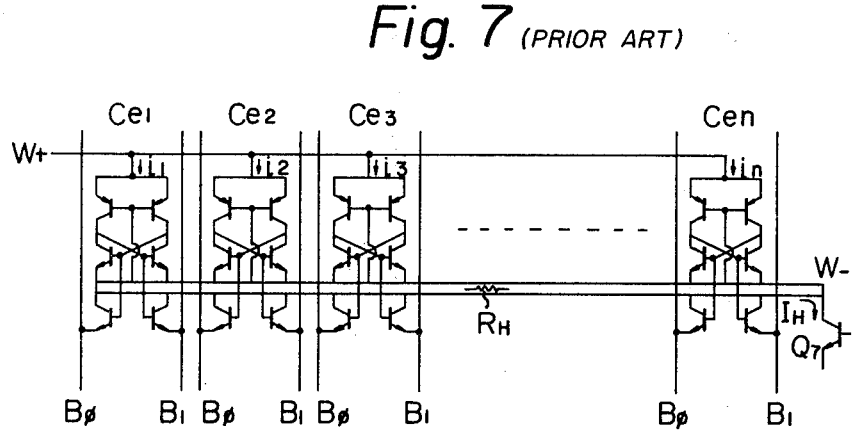
FIG. 7 illustrates one row of a prior-art memory-cell array which includes a current source at one end of the word line.
Figure 8:
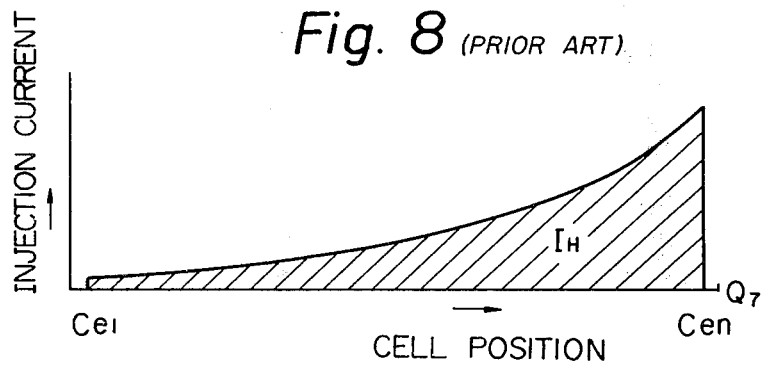
FIG. 8 is a diagram illustrating a distribution of injection currents supplied to the memory cells in the row of FIG. 7.

When the hold current $I_H$ is supplied via the transistor $Q_7$ in the circuit illustrated in FIG. 5, the injection current supplied to each memory cell exponentially decreases from the cell $Ce_{r-1}$ to the cell $Ce_1$ and from the cell $ce_r$ to the cell $Ce_n$, is as shown in FIG. 6, due to the resistance $R_H$, which exists in the word line $W-$ between each cell. However, the uniformity of the distribution of the injection currents obtained by this embodiment is greatly improved over the case when one current-source transistor is provided at one end of the word line $W-$, as will be understood by comparing this embodiment with FIGS. 7 and 8 illustrating the prior art. FIG. 7 illustrates one row of the conventional memory-cell array which includes a current-source transistor $Q_7$ at one end of the word line $W-$. FIG. 8 is a diagram illustrating a distribution of injection currents supplied to the memory cells in the row of FIG. 7. Referring to FIGS. 7 and 8, when the hold current $I_H$ is supplied via the transistor $Q_7$ in the circuit illustrated in FIG. 7, the injection current supplied to each memory cell exponentially decreases from the cell $Ce_n$ to the cell $Ce_1$ as shown in FIG. 8, due to the resistance $R_H$. That is, the injection current $i_1$ supplied to the cell $Ce_1$, which is at an opposite end to the transistor $Q_7$, has a minimum value of all the other injection currents $i_2$ through $i_n$ supplied to the cells $Ce_2$ through $Ce_n$, respectively.

The injection current wich can assure the function of the memory cells, has a lower limit which is determined by a current amplification factor $h_{FE}$ of the transistor. Further, since it is required that all memory cells in the memory array be operated by conducting the hold current $I_H$ through the memory array, the hold current $I_H$ must be determined so that the injection current $i_1$, which is the minimum of all the injection currents $i_1$ through $i_n$, is larger than the current for operating the cell $Ce_1$. Therefore, surplus injection currents must be supplied to the cells $Ce_2, \ldots, Ce_n$, and the resulting excessive electrical power must be consumed in the memory array. Further, as the injection current to each cell is exponentially distributed, as shown in FIG. 8, in accordance with the position of the cells, the read and write characteristics of the memory cells are also different in accordance with the position of the cells.

Figure 9:
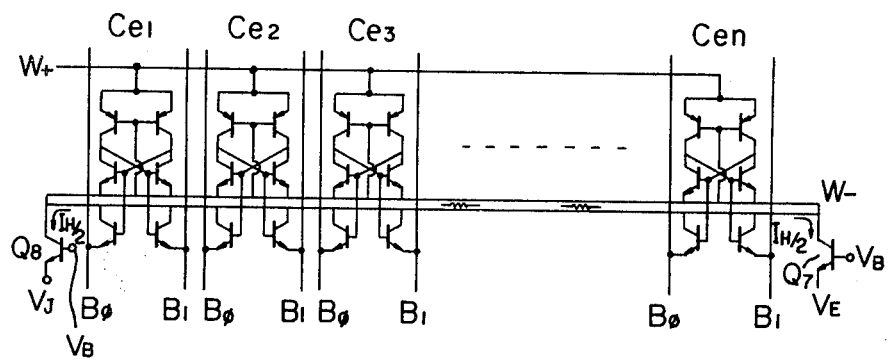
FIG. 9 illustrates one row of another prior-art memory-cell array which includes two current sources at both ends of the word line.
Figure 10:
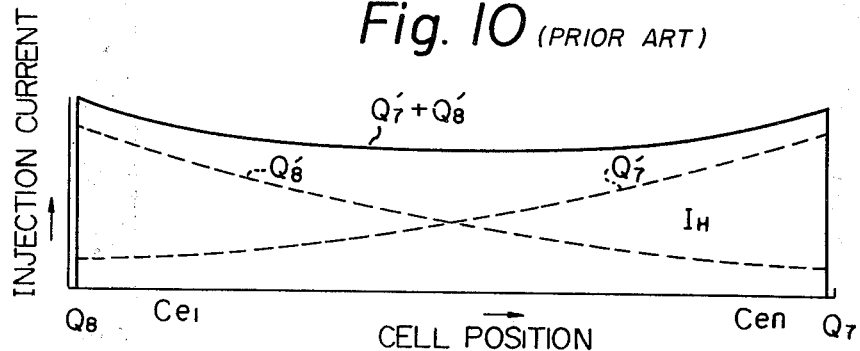
FIG. 10 is a diagram illustrating a distribution of injection currents supplied to the memory cells in the row of FIG. 9.

The uniformity of the distribution of the injection currents obtained by the embodiment of FIG. 2 is substantially the same as the case when a current-source transistor is provided at each ends of the word line W—, as will be understood by comparing FIGS. 2 and 6 of the present embodiment with FIGS. 9 and 10 of another prior art array. FIG. 9 illustrates one row of a memory-cell array which includes a current-source transistor at each end of the word line. In FIG. 9, the transistor $Q_7$ is connected to one end of the word line W—, at a position near the memory cell $Ce_n$, and a current $^IH/2$ is supplied to the transistor $Q_7$. A transistor $Q_8$ is connected to the other end of the word line W—, at a position near the memory cell $Ce_1$, and the current $^IH/2$ is supplied to the transistor $Q_8$. That is, in this circuit of FIG. 9, the transistors $Q_7$ and $Q_8$ are connected respectively to each end of the word line W—and the hold current $I_H$ is equally distributed to the transistors $Q_7$ and $Q_8$.

The distribution of the injection currents supplied to each cell in the circuit illustrated in FIG. 9 is shown in the diagram of FIG. 10. Referring to FIG. 10, a broken line $Q'_7$ shows the distribution of the injection currents when only the transistor $Q_7$ is provided, and the broken line $Q'_8$ shows the distribution of the injection currents when only the transistor $Q_8$ is provided. As seen from the broken lines $Q_7$ and $Q_8$, the value of the injection current has a maximum value at the side where the transistor is connected and the values of the injection current decrease exponentially. However, as the transistors $Q_7$ and $Q_8$ are respectively connected to each end of the word line W—, the distribution of the injection current which is shown by the solid line $Q'_7 + Q'_8$ can be obtained. That is, by the combination of the characteristics shown by the broken lines $Q'_7$ and $Q'_8$, the injection current supplied to each cell can be equalized. It should be noted that the uniformity of the current distribution of FIG. 6 of the present embodiment is substantially equal to that of FIG. 10, because the curve of FIG. 6 can be obtained by cutting the solid curve of FIG. 10 at the middle position of the transverse axis, and bringing one end face to face with the other end. Therefore, according to the embodiment of FIG. 2, only a single current-source transistor is required in each row without deteriorating the characteristic of injection-current distribution, and thus, the integration degree is greatly reduced.

Figure 11:
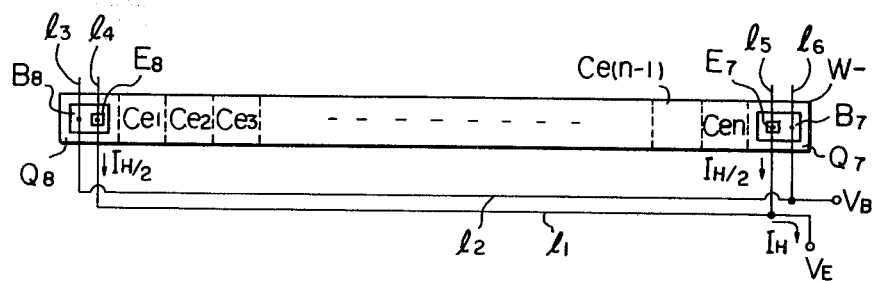
FIG. 11 illustrates a plan view of the row illustrated in FIG. 9.

In addition, still another advantage of the present embodiment is that the wiring of the bias lines can be simplified over the memory-cell array of FIG. 9. This advantage will easily be understood by comparing the memory-cell array of FIG. 1 of the present embodiment with that of FIG. 11. FIG. 11 illustrates a plan view of the row illustrated in FIG. 9. Referring to FIG. 11, the word line W—, that is, the common n-type conduction region of the bulk, is commonly used in the collectors of the transistor $Q_7$ and $Q_8$. An area of the emitter $E_7$ of the transistor $Q_7$ is connected through the bias line $l_5$ and a bias line $l_1$ to a terminal $V_E$. Also, an area of the emitter $E_8$ of the transistor $Q_8$ is connected through a bias line $l_4$ and the bias line $l_1$ to the terminal $V_E$. Further, a base $B_7$ of the transistor $Q_7$ is connected through the bias line $l_6$ and a bias line $l_2$ to a terminal $V_B$, and a base $B_8$ of the transistor $Q_8$ is connected through a bias line $l_3$ and the bias line $l_2$ to the terminal $V_B$. When a suitable bias voltage is supplied between the terminals $V_B$ and $V_E$, so as to supply the hold current $I_H$, equal currents $^IH/2$ are supplied to the transistors $Q_7$ and $Q_8$, which have an equal emitter area, so that the distribution of the injection current shown in FIG. 10 can be obtained. Therefore, according to the prior memory-cell array of FIG. 11, a number of bias lines $l_1, l_2, l_3, l_4, l_5$ and $l_6$ are required. In contrast to this, according to the present embodiment, since the bias circuit BC is provided on the middle portion of the bit driver array BDV, as previously mentioned, only two bias lines $l_5$ and $l_6$ are required, as illustrated in FIG. 1. Moreover, as can be seen from the circuit of FIG. 2 of the present embodiment, the bias lines $l_5$ and $l_6$ are parallel to bit lines $B_\emptyset$ and $B_1$. The area where the bias lines $l_5$ and $l_6$ are provided does not require the bit lines $B_\emptyset$ and $B_1$, because in this area, the current-source transistors $Q_7$ are provided. Therefore, in this area, lines manufactured by the same process as that used in manufacturing the bit lines can be used as the bias lines $l_5$ and $l_6$. Further, according to the present embodiment, the power lines of the bias circuit BC can be commonly used as the power lines of the bit-driver array BVD. As a result, according to the present embodiment, wiring in the memory-cell array is greatly simplified over that in the prior art.

Although the word line W— is the n-type conduction region in the foregoing embodiment, alternatively, the word line W—may be a p-type conduction region. When the p-type word line W— is used, the conduction type of the memory-cells and the current-source transistors must be properly selected. In this modification, however, the resistance of the word line W-of p-type conductivity is larger than that of n-type conductivity, so that the uniformity of the injection currents is slightly deteriorated in comparison with the foregoing embodiment.

From the foregoing description, it will be understood that, according to the present invention, since the bias-voltage supplying points are selected at middle portions of the word lines W— in the memory-cell array, compared with the prior art, the number of the current-source transistors is decreased. The integration degree of the memory-cell array is improved, and the wiring is simplified. Nevertheless, according to the present invention, the same uniformity of injection-current distribution is obtained as in the case when a current-source transistor is provided at each end of the word line.

What is claimed is:

1. A semiconductor memory device having a plurality of word lines formed on a semiconductor substrate, and a plurality of integrated-injection-logic memory cells commonly connected to each of said word lines, said memory cells being arranged in a matrix form, said semiconductor memory device comprising current sources, respectively connected to said word lines, only a single one of said current sources connected around the middle portion of a corresponding one of said plurality of word lines, a bias circuit for providing a bias voltage to all of said current sources, and only a single pair of bias lines operatively connected between said bias circuit and all of said current sources, said single pair of bias lines extending across the middle portion of each of said plurality of word lines and being orthogonal to each of said plurality of word lines.

2. A semiconductor memory device as claimed in claim 1, further comprising a plurality of bit lines ($B_0$ and $B_1$) intersecting said word lines.

3. A semiconductor memory device as claimed in claim 2, further comprising a bit driver for driving said bit lines, said bias circuit being provided at the middle portion of said bit driver, each single one of said current sources being connected to said bias circuit through said pair of bias lines ($l_5$, $l_6$) extending in parallel to said bit lines.

4. A semiconductor memory device as claimed in claim 3, wherein each said single current source is comprised of a transistor, the base of the transistor being connected to one of said bias lines and the emitter of said transistor being connected to the other of said bias lines.

5. A semiconductor memory device comprising:
a semiconductor substrate;
a plurality of word lines formed on said semiconductor substrate;
a plurality of injection-logic memory cells formed in said semiconductor substrate in a matrix form and commonly connected to each of said plurality of word lines;
current sources, respectively connected to said plurality of word lines, only a single one of said current sources operatively connected at approximately the middle of a corresponding one of said plurality of word lines;
a bias circuit for providing a bias voltage to said current sources; and
only a single pair of bias lines, operatively connected between said bias circuit and said current sources, extending across the middle of each of said plurality of word lines and orthogonal to each of said plurality of word lines.

6. A semiconductor memory device as claimed in claim 5, further comprising:
a plurality of bit lines intersecting said word lines;
a bit driver, operatively connected to said plurality of bit lines, for driving said plurality of bit lines; and
said bias circuit operatively connected to the middle portion of said bit driver, each of said current sources being connected to said bias circuit through said single pair of bias lines which extend parallel to said plurality of bit lines.

7. A semiconductor memory device as claimed in claim 6, wherein each of said current sources comprises a transistor having a base operatively connected to one bias line of said single pair of bias lines and having an emitter operatively connected to the other bias line of said single pair of bias lines.

* * * * *

UNITED STATES PATENT AND TRADEMARK OFFICE
CERTIFICATE OF CORRECTION

PATENT NO. : 4,419,745
DATED : DECEMBER 6, 1983
INVENTOR(S) : KAZUHIRO TOYODA ET AL.

It is certified that error appears in the above-identified patent and that said Letters Patent is hereby corrected as shown below:

Col. 2, line 7, "the" (first occurrence) should be --a--;
line 39, "linesand" should be --lines and--;
line 43, "object" should be --objects--.

Col. 4, line 18, after "has" insert --a--;
line 20, "metalic" should be --metallic--.

Col. 5, line 15, "ends" should be --end--;
line 27, "this" should be --the--;
line 38, "Q7 and Q8" should be --$Q'_7$ and $Q'_8$--.

Signed and Sealed this

Twenty-fourth Day of April 1984

[SEAL]

Attest:

GERALD J. MOSSINGHOFF

Attesting Officer      Commissioner of Patents and Trademarks